(12) United States Patent
Park et al.

(10) Patent No.: US 8,537,502 B1
(45) Date of Patent: Sep. 17, 2013

(54) METHOD AND SYSTEM FOR PROVIDING A MAGNETIC TRANSDUCER HAVING IMPROVED SHIELD-TO-SHIELD SPACING

(75) Inventors: Chando Park, Palo Alto, CA (US); Qunwen Leng, Palo Alto, CA (US); Sangmun Oh, Fremont, CA (US); Mahendra Pakala, Fremont, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 731 days.

(21) Appl. No.: 12/363,525

(22) Filed: Jan. 30, 2009

(51) Int. Cl.
G11B 5/127 (2006.01)
(52) U.S. Cl.
USPC ...................... 360/324.11; 428/816
(58) Field of Classification Search
None
See application file for complete search history.

(56) References Cited

U.S. PATENT DOCUMENTS

| 6,735,058 | B2 | 5/2004 | Lin et al. |
| 7,105,372 | B2* | 9/2006 | Min et al. ................ 438/48 |
| 7,170,725 | B1 | 1/2007 | Zhou et al. |
| 7,227,728 | B2 | 6/2007 | Lin |
| 7,369,376 | B2 | 5/2008 | Guo et al. |
| 2007/0064352 | A1 | 3/2007 | Gill |
| 2007/0111332 | A1 | 5/2007 | Zhao et al. |
| 2007/0146928 | A1 | 6/2007 | Zhang et al. |
| 2008/0080101 | A1 | 4/2008 | Mauri et al. |
| 2008/0137236 | A1 | 6/2008 | Lee et al. |
| 2008/0144234 | A1 | 6/2008 | Lin |
| 2008/0171223 | A1 | 7/2008 | Wang et al. |
| 2009/0251829 | A1* | 10/2009 | Zhang et al. .................. 360/319 |
| 2010/0128400 | A1* | 5/2010 | Lin ............................... 360/319 |

OTHER PUBLICATIONS

Pakala et al., "Effect of underlayer roughness, grain size, and crystal texture on exchange coupled IrMn/CoFe thin films", Journal of Applied Physics, vol. 87, No. 9, May 1, 2000, pp. 6653-6655.
Lee et al., "Exchange biasing field of NiFe/[IrMn—Mn]/CoFe multilayers depending on Mn content", Journal of Applied Physics, vol. 95, No. 11, Jun. 1, 2004, pp. 7525-7527.
Furjanic et al., "The Effects of Ruthenium and Grain Size on Spin Valves With Ultra Thin Antiferromagnetic Pinning Layers", IEEE Transactions on Magnetics, vol. 43, No. 6, Jun. 2007, pp. 2845-2847.

* cited by examiner

Primary Examiner — Holly Rickman

(57) ABSTRACT

A method and system for providing a magnetic transducer is described. The method and system include providing a magnetic structural barrier layer and a crystalline magnetic layer on the magnetic structural barrier layer. The magnetic structural barrier layer may reside on a shield. The method and system also include providing a nonmagnetic layer on the crystalline magnetic layer. A pinning layer is provided on the nonmagnetic layer. Similarly, a pinned layer is provided on the pinning layer. The pinning layer is magnetically coupled with the pinned layer. The method and system also include providing a free layer and a nonmagnetic spacer layer between the pinned layer and the free layer.

12 Claims, 4 Drawing Sheets

METHOD AND SYSTEM FOR PROVIDING A MAGNETIC TRANSDUCER HAVING IMPROVED SHIELD-TO-SHIELD SPACING

BACKGROUND

FIG. 1 depicts a portion of a conventional magnetic transducer 10, such as a conventional read transducer or other device. The conventional transducer 10 resides on a conventional substrate 11, such as an AlTec substrate. The conventional transducer 10 includes a conventional bottom shield 12, conventional seed layers 14 and 16, conventional antiferromagnetic (AFM) layer 18, conventional sensor 20, and conventional top shield 30. The conventional bottom seed layer 14 typically includes Ta or Cu and adjoins, or shares an interface with, the conventional shield 12. The thickness of the Ta layer 14 is typically twenty through fifty Angstroms. The conventional seed layer 16 typically includes Ru, NiFeCr, NiFe, or CoFe and adjoins the conventional nonmagnetic seed layer 14. Thus, the conventional seed layers 14 and 16 may be viewed as forming a bi-layer seed layer including, for example, Ta/Ru, Ta/NiFe, Ta/NiFeCr, or Ta/CoFe layers. The conventional shields 12 and 30 typically include NiFe and are formed by plating.

The conventional sensor 20 typically includes a pinned layer that is usually a synthetic antiferromagnetic (SAF) layer 22, a nonmagnetic layer 24, a free layer 26, and a capping layer 28. The conventional SAF layer 22 typically includes two ferromagnetic layers (not separately shown) separated by a nonmagnetic spacer layer (not shown). The ferromagnetic layers are generally antiferromagnetically coupled. The magnetization(s) of the conventional SAF layer 22 are pinned by the conventional AFM layer 18. More specifically, the first ferromagnetic layer adjoining the conventional AFM layer 18 has its magnetization pinned by the conventional AFM, for example via exchange interaction. The remaining ferromagnetic layer has its magnetization pinned because it is strongly magnetically coupled with the first ferromagnetic layer. The conventional nonmagnetic layer 24 may be a barrier layer or a conductive spacer layer. If a barrier layer 24 is used, then the sensor 20 is a tunneling magnetoresistive (TMR) sensor. If a conductive spacer layer 24 is used, then the sensor 20 is a spin valve or for current perpendicular to the plane giant magnetoresistance sensor.

Although the conventional transducer 10 and conventional sensor 20 may function, issues may arise in higher density magnetic recording applications. The areal storage density in a hard disk drive using the conventional transducer 10 increases dramatically every year. In order to maintain the magnetic properties of the transducer 10, such as high exchange bias and reduced dispersion, the shield-to-shield distance, $h_1$, is desired to be decreased. However, reduction of the thickness of various layers, such as the conventional AFM layer 18 or conventional seed layers 14 and 16 adversely affects performance of these layers. For example, reducing the thickness of the conventional AFM layer 18 may reduce its ability to pin the magnetizations of the conventional SAF 22. This may allow the magnetizations of the conventional SAF 22 to change direction, at least to a degree. Consequently performance of the conventional transducer 10 is adversely affected. Similarly, a reduction in the thicknesses of the conventional seed layers 14 and 16 may reduce the quality of the conventional AFM layer 18. As a result, the ability of the conventional AFM layer 18 to pin the magnetization of the conventional SAF 22 is again diminished. Consequently, performance of the conventional magnetic transducer 10 may again be adversely impacted.

Accordingly, what is needed is a system and method for providing a transducer having a reduced shield-to-shield spacing that may be usable for higher density recording.

BRIEF SUMMARY OF THE INVENTION

A method and system for providing a magnetic transducer is described. The method and system include providing a magnetic structural barrier layer and a crystalline magnetic layer on the magnetic structural barrier layer. The magnetic structural barrier layer may reside on a shield. The method and system also include providing a nonmagnetic layer on the crystalline magnetic layer. A pinning layer is provided on the nonmagnetic layer. Similarly, a pinned layer is provided on the pinning layer. The pinning layer is magnetically coupled with the pinned layer. The method and system also include providing a free layer and a nonmagnetic spacer layer between the pinned layer and the free layer. In another aspect, the method and system include providing the magnetic structural barrier layer, the crystalline magnetic layer on the magnetic structural barrier layer, the nonmagnetic layer and the pinning layer. In this aspect, a sensor is provided on the pinning layer.

DETAILED DESCRIPTION OF THE PREFERRED EMBODIMENTS

Figure 1:
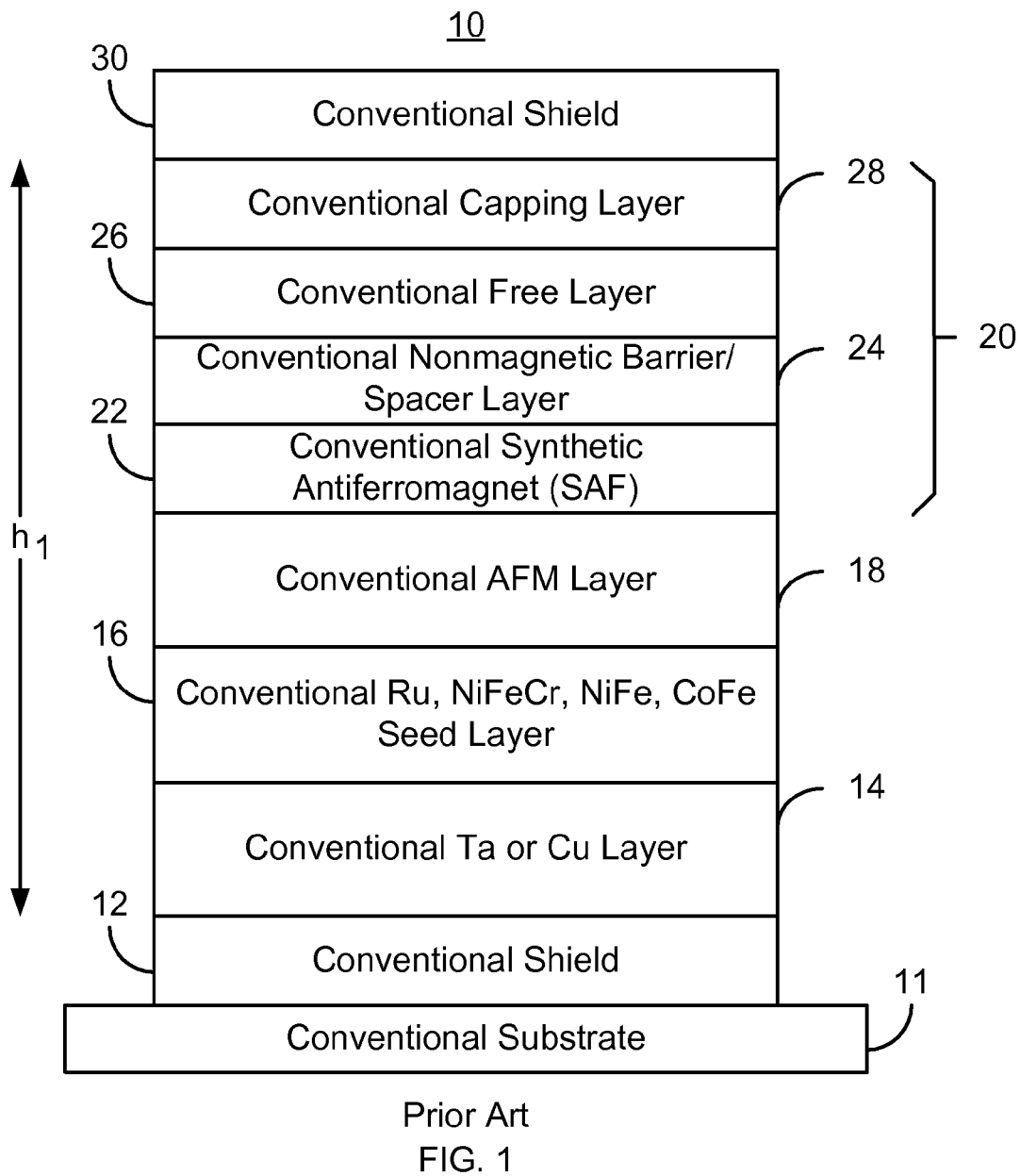
FIG. 1 is a diagram of a portion of a conventional transducer including a conventional sensor.
Figure 2:
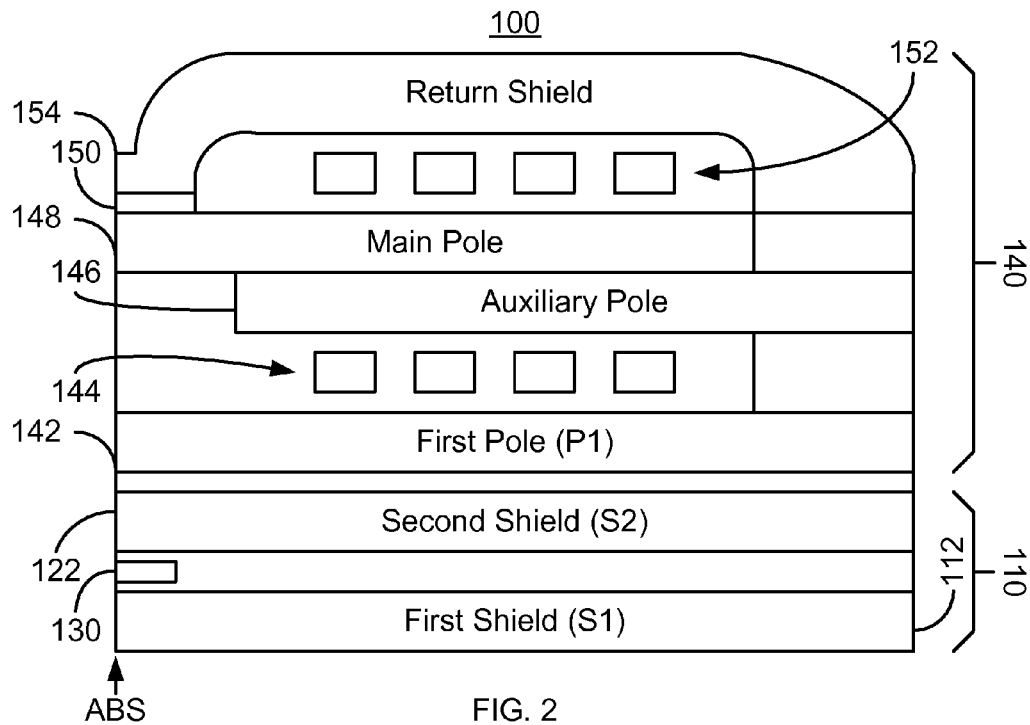
FIG. 2 depicts an exemplary embodiment of a head having a transducer including an exemplary embodiment of seed layers.
Figure 3:
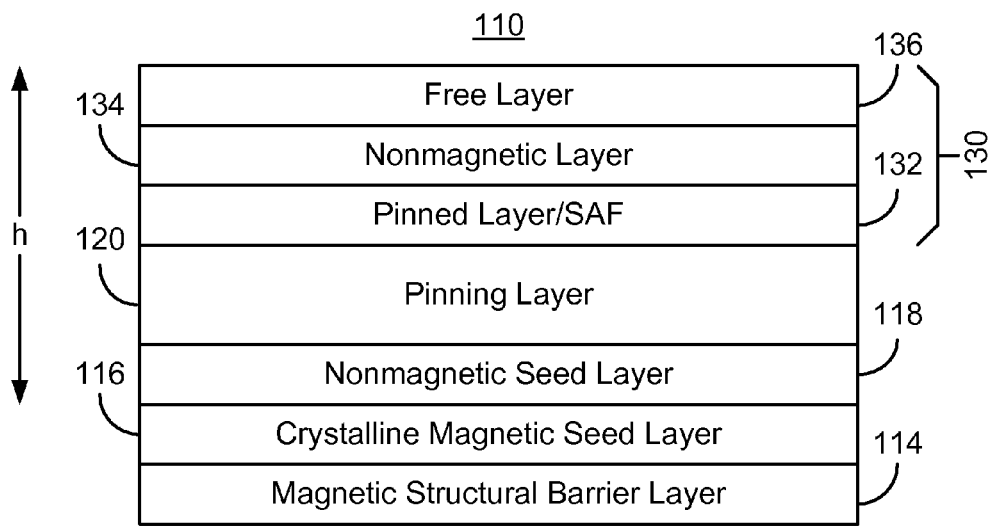
FIG. 3 depicts an exemplary embodiment of a portion of transducer including an exemplary embodiment of seed layers.

FIG. 2 depicts a magnetic head 100. The magnetic head includes a magnetic read transducer 110 and write transducer 140. FIG. 3 depicts an exemplary embodiment of a portion of transducer 110 including an exemplary embodiment of seed layers. FIG. 3 may be considered a portion of the ABS view of the transducer 110. Referring to FIGS. 2-3, in another embodiment, the head 100 might include only the read transducer 110. The head 100 may reside on a slider (not shown) of a disk drive (not shown). The head 100 is also described in the context of particular layers. However, in some embodiments, such layers may include sub-layer(s). For clarity, FIGS. 2-3 are not drawn to scale.

The write transducer 140 includes a first pole 142, auxiliary pole 146, main pole 148, write gap 150, coils 144 and 152, and return shield 154. However, in another embodiment, the write transducer 140 other and/or different components. In addition, one or more portions of the write transducer 140 might be omitted in various embodiments.

The read transducer 110 includes shields 112 and 122 and sensor 130. In addition, as shown expressly in FIG. 3, the read transducer 110 includes seed layers 114, 116, and 118. In particular, the read transducer 110 contains a magnetic structural barrier layer 114, a crystalline magnetic seed layer 116, and a nonmagnetic seed layer 118.

The magnetic structural barrier layer 114 is magnetic (e.g. ferromagnetic) and thus may be magnetically coupled with the shield 112. However, as deposited, the magnetic structural barrier layer 114 is generally amorphous and functions to break the structural coupling between the shield 112 and subsequent layers during fabrication. The magnetic structural barrier layer 114 may thus include a spin glass, which is generally considered to be a highly disordered material (i.e. is amorphous). Such spin glasses include FeZrB based alloys, CoZrB based alloys, NiZrB based alloys, NdFeAl, based alloys, and NdFeSi based alloys. In some embodiments, the individual constituents may range from zero concentration and above. The magnetic structural barrier layer 114 may also include one or more of CoFeB, NiFeB, CoFeBTa, and CoFeZr, where the concentration of Co, Fe, and/or Ni may range from zero to one hundred percent in various embodiments. In some embodiments, the magnetic structural barrier layer 114 is amorphous in structure as deposited. After fabrication of the transducer 110 is completed, the magnetic structural barrier layer 114 might be amorphous and/or crystalline in structure. In some embodiments, the magnetic structural barrier layer 114 has a thickness of at least five and not more than fifty Angstroms. In some such embodiments, this thickness is at least eight and not more than twelve Angstroms. The thickness of the magnetic structural barrier layer 114 is sufficient to break any structural coupling between the shield 112 and the crystalline magnetic seed layer 116.

The crystalline magnetic seed layer 116 may also be ferromagnetic, but is crystalline in structure. For example, the crystalline magnetic seed layer 116 may include one or more of NiFe, CoFe, CoFeNi, and NiFeCr. In various embodiments, the concentration of Co, Fe, and/or Ni may range from zero to one hundred percent. The magnetic seed layer 116 is magnetically coupled with the magnetic structural barrier layer 114, and thus with the shield 112. However, the crystalline magnetic seed layer 116 is structurally decoupled from the shield 112. Stated differently, the crystal structure of the crystalline magnetic seed layer 116 is not determined by the crystal structure of the shield 112. In some embodiments, the crystalline magnetic seed layer 116 may be sputtered. The crystalline magnetic seed layer 116 has a thickness of at least ten and not more than three hundred Angstroms in some embodiments. In some such embodiments, this thickness is at least thirty-five and not more than fifty Angstroms.

The nonmagnetic seed layer 118 resides on the crystalline magnetic seed layer 116. The nonmagnetic seed layer 118 has the desired structure for the pinning layer 120. The nonmagnetic seed layer 118 may include materials such as one or more of Ru, NiFeCr (nonmagnetic), Cu, and Hf. The nonmagnetic seed layer 118 has a thickness of at least two and not more than thirty Angstroms in various embodiments. In some such embodiments, this thickness is at least five and not more than twenty Angstroms. A nonmagnetic seed layer 118 is desired to improve the thermal stability and increase exchange field of the pinning layer 120.

The pinning layer 120 resides on the nonmagnetic seed layer 118. The pinning layer 120 may be an AFM layer, such as IrMn and/or PtMn. The pinning layer 120 is used to pin, or substantially affix, the magnetization(s) of subsequent layers, such as the pinned layer 132.

The sensor 130 shown may be a spin valve, TMR, dual spin valve, dual TMR, or other sensor in which the magnetization of a layer is desired to be pinned using the pinning layer 120. In some embodiments, the structure 130 might be used for other functions than as a sensor. In the embodiment shown, the sensor 130 includes a pinned layer 132, a nonmagnetic spacer layer 134, and a free layer 136. The sensor 130 might include other layers (not shown). The pinned layer 132 may be a SAF, such as described above. In other embodiments a simple layer, such as a simple ferromagnetic layer, may be used for the pinned layer 132. The nonmagnetic spacer layer 134 may be an insulating tunneling barrier or a conductive spacer layer. Other structures may also be used for the nonmagnetic spacer layer 134. The free layer 136 may be the sensing layer. In some embodiments, the free layer 136 is a simple, ferromagnetic layer. In other embodiments, the free layer 136 may be a multilayer, including a SAF.

Use of the combination of seed layers 114, 116, and 118 may improve performance of the transducer 110. It has been reported that a NiFe layer may act effectively as a seed layer for subsequent antiferromagnetic layer such as IrMn and PtMn. The high degree of texture in antiferromagnetic layer is reported to produce high exchange bias and less dispersion. In the transducer 110, use of the magnetic structural barrier layer 114 breaks the structural coupling between the shield 112 and the crystalline magnetic seed layer 118. The crystalline magnetic seed layer 116 may have a high degree of orientation, and thus have its texture to a large extent in the desired orientation. This may increase the degree to which the pinning layer 120 has the desired texture. For example, an IrMn or PtMn pinning layer 120 may be more likely to have a (111) orientation when the crystalline magnetic seed layer 116 is used. In addition, the grain size of the pinning layer 120 may be increased. In general, the grain size and texture of an AFM layer is related to the thickness of sputtered crystalline magnetic layer 116 on which the AFM layer resides. The pinning layer 120 may have improved performance for a larger thickness of the crystalline magnetic seed layer 112.

Thus, the magnetic properties of pinning layer 120, such as exchange bias and coercivity, may be improved. This may be achieved while the shield-to-shield spacing, h, is maintained or reduced. In particular, the ability of the pinning layer 120 to pin the magnetization of the pinned layer 132 may be enhanced by the increased grain size and texture. In some embodiments, the thickness of the pinning layer 120 may be reduced while maintaining the desired magnetic properties. Thus, the shield-to-shield spacing, h, may be decreased. Further, the magnetic structural barrier layer 114 and crystalline magnetic seed layer 116, though structurally decoupled from the shield 112, are magnetically coupled with the shield 112. Consequently, the layers 114 and 116 may be considered to be magnetically part of the shield 112. The thicknesses of the magnetic structural barrier layer 114 and crystalline magnetic seed layer 116 may be adjusted without increasing the shield-to-shield spacing because the layers 114 and 116 are magnetically coupled to/part of the shield. The thicknesses of the layers 114 and 116 may be tailored to improve the magnetic properties of the pinning layer 120 without increasing the shield-to-shield spacing. Thus, the shield-to-shield spacing, h, might be considered to be further reduced. Issues such as dispersion may also be reduced. Consequently, performance of the pinning layer 120 may be improved while maintaining or reducing the shield-to-shield spacing of the transducer 110. Performance of the transducer 110 may be enhanced.

Figure 4:
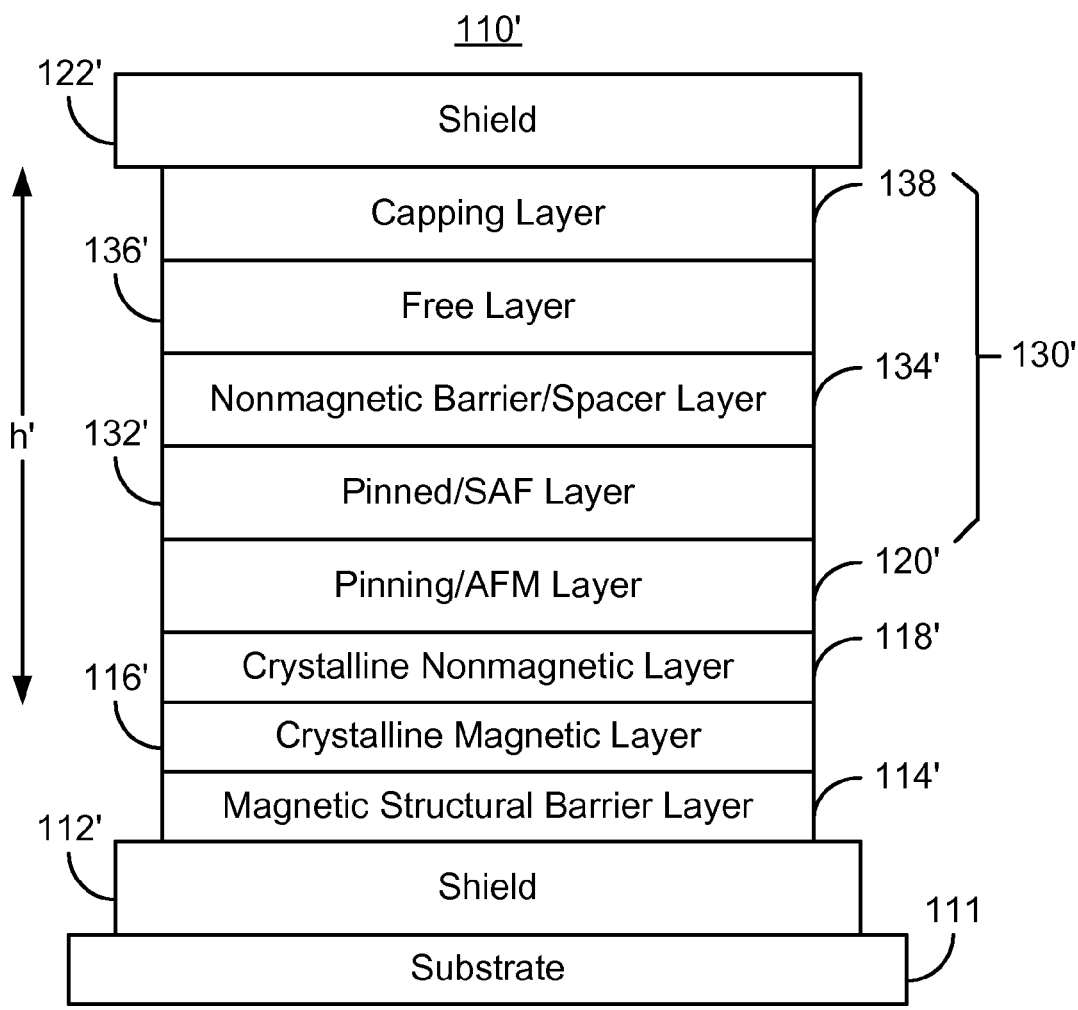
FIG. 4 depicts another exemplary embodiment of a portion of transducer including an exemplary embodiment of seed layers.

FIG. 4 depicts another exemplary embodiment of a portion of transducer 110' including an exemplary embodiment of seed layers. The transducer 110' may be analogous to the transducer 110. Consequently, analogous portions of the transducer 100' are labeled in a similar manner to the components of the transducer 110. Further, the transducer 110' may be part of a merged head that may also include a write transducer, such as the transducer 140, reside on a slider (not shown) of a disk drive (not shown). The transducer 110' is described in the context of particular layers. However, in some embodiments, such layers may include sub-layer(s). For clarity, FIG. 4 is not drawn to scale.

The transducer 110' includes shields 112' and 122', seed layers 114', 116', and 118', pinning or AFM layer 120', and sensor 130'. In particular, the transducer 110' include a magnetic structural barrier layer 114', a crystalline magnetic seed layer 116', and a nonmagnetic seed layer 118'. The sensor 130' includes a pinned layer 132', a nonmagnetic spacer layer 134' that may be a barrier layer or conductive layer, a free layer 136', and a capping layer 138. The sensor 130' may thus be a spin valve, TMR, dual spin valve, dual TMR, or other sensor in which the magnetization of a layer is desired to be pinned using the pinning layer 120'. In some embodiments, the structure 130' might be used for other functions than as a sensor. The sensor 130' might include other layers (not shown). The pinned layer 132' may be a SAF, such as described above. In other embodiments a simple layer, such as a simple ferromagnetic layer, may be used for the pinned layer 132'. The nonmagnetic spacer layer 134' may be an insulating tunneling barrier or a conductive spacer layer. Other structures may also be used for the nonmagnetic spacer layer 134'. The free layer 136' may be the sensing layer. In some embodiments, the free layer 136' is a simple, ferromagnetic layer. In other embodiments, the free layer 136' may be a multilayer, including a SAF.

The magnetic structural barrier layer 114' is magnetic (e.g. ferromagnetic) and thus may be magnetically coupled with the shield 112'. In a similar manner to the magnetic structural barrier layer 114, the magnetic structural barrier layer 114' may be amorphous as deposited and amorphous and/or crystalline after fabrication of the transducer 110' is complete. The magnetic structural barrier layer 114' may include a spin glass. The magnetic structural barrier layer 114' may thus include FeZrB based alloys, CoZrB based alloys, NiZrB based alloys, NdFeAl, based alloys, and NdFeSi based alloys. In some embodiments, the individual constituents may range from zero concentration and above. The magnetic structural barrier layer 114' may also include one or more of CoFeB, NiFeB, CoFeBTa, and CoFeZr, where the concentration of Co, Fe, and/or Ni may range from zero to one hundred percent in various embodiments. However, in such embodiments, the magnetic structural barrier layer 114' may be amorphous in structure as deposited, and thus able to break structural coupling between the shield 112' and subsequent layers such as the crystalline magnetic layer 116'. In some embodiments, the magnetic structural barrier layer 114' has a thickness of at least five and not more than fifty Angstroms. In some such embodiments, this thickness is at least eight and not more than twelve Angstroms. The thickness of the magnetic structural barrier layer 114' is sufficient to break any structural coupling between the shield 112' and the crystalline magnetic seed layer 116'.

The crystalline magnetic seed layer 116' is magnetic (e.g. ferromagnetic) and may be sputtered. Unlike the magnetic structural barrier layer 114, however, the crystalline magnetic seed layer 116' is crystalline in structure as deposited. Thus, the crystalline magnetic seed layer 116' is ordered. For example, the crystalline magnetic seed layer 116' may include one or more of NiFe, CoFe, CoFeNi, and NiFeCr. In various embodiments, the concentration of Co, Fe, and/or Ni may range from zero to one hundred percent. The magnetic seed layer 116' is magnetically coupled with the magnetic structural barrier layer 114'. The crystalline magnetic seed layer 116' is, therefore, also magnetically coupled with the shield 112'. However, the crystalline magnetic seed layer 116' is structurally decoupled from the shield 112'. The crystalline magnetic seed layer 116' has a thickness of at least ten and not more than three hundred Angstroms in some embodiments. In some such embodiments, this thickness is at least thirty-five and not more than fifty Angstroms. The crystalline magnetic layer 116' may also be strongly oriented in the desired direction.

The nonmagnetic seed layer 118' resides on the crystalline magnetic seed layer 116 and has the desired structure and orientation for the pinning layer 120'. The nonmagnetic seed layer 118' may include materials such as one or more of Ru, nonmagnetic NiFeCr, Cu, and Hf. The nonmagnetic seed layer 118' has a thickness of at least two and not more than thirty Angstroms in various embodiments. In some such embodiments, this thickness is at least five and not more than twenty Angstroms.

The pinning layer 120' resides on the nonmagnetic seed layer 118'. The pinning layer 120' may be an AFM layer, such as IrMn and/or PtMn. The pinning layer 120' is used to pin the magnetization(s) of subsequent layers, such as the pinned layer 132'.

The transducer 110' shares the benefits of the transducer 110. Use of the seed layers 114', 116', and 118' may improve performance of the transducer 110'. In particular, the seed layers 114', 116', and 118' may improve the texture and/or grain size of the pinning layer 120'. Use of the magnetic structural barrier layer 114' breaks structural coupling between the shield 112' and the crystalline magnetic seed layer 118'. The crystalline magnetic seed layer 116', which may include crystalline/sputtered NiFe, may have a high degree of orientation. This may increase the degree to which the pinning layer 120' has the desired texture. In addition, the grain size of the pinning layer 120' may be increased. These improvements may be achieved without increasing the shield-to-shield spacing, h', of the magnetic transducer 110'. In some embodiments, the shield-to-shield spacing may be reduced. This is at least in part because, the seed layers 114' and 116' may be considered to be magnetically part of the shield 112'. The thicknesses of the layers 114' and 116' may be tailored to improve the magnetic properties of the pinning layer 120' without increasing the shield-to-shield spacing. Consequently, performance of the transducer 110' may be improved.

Figure 5:
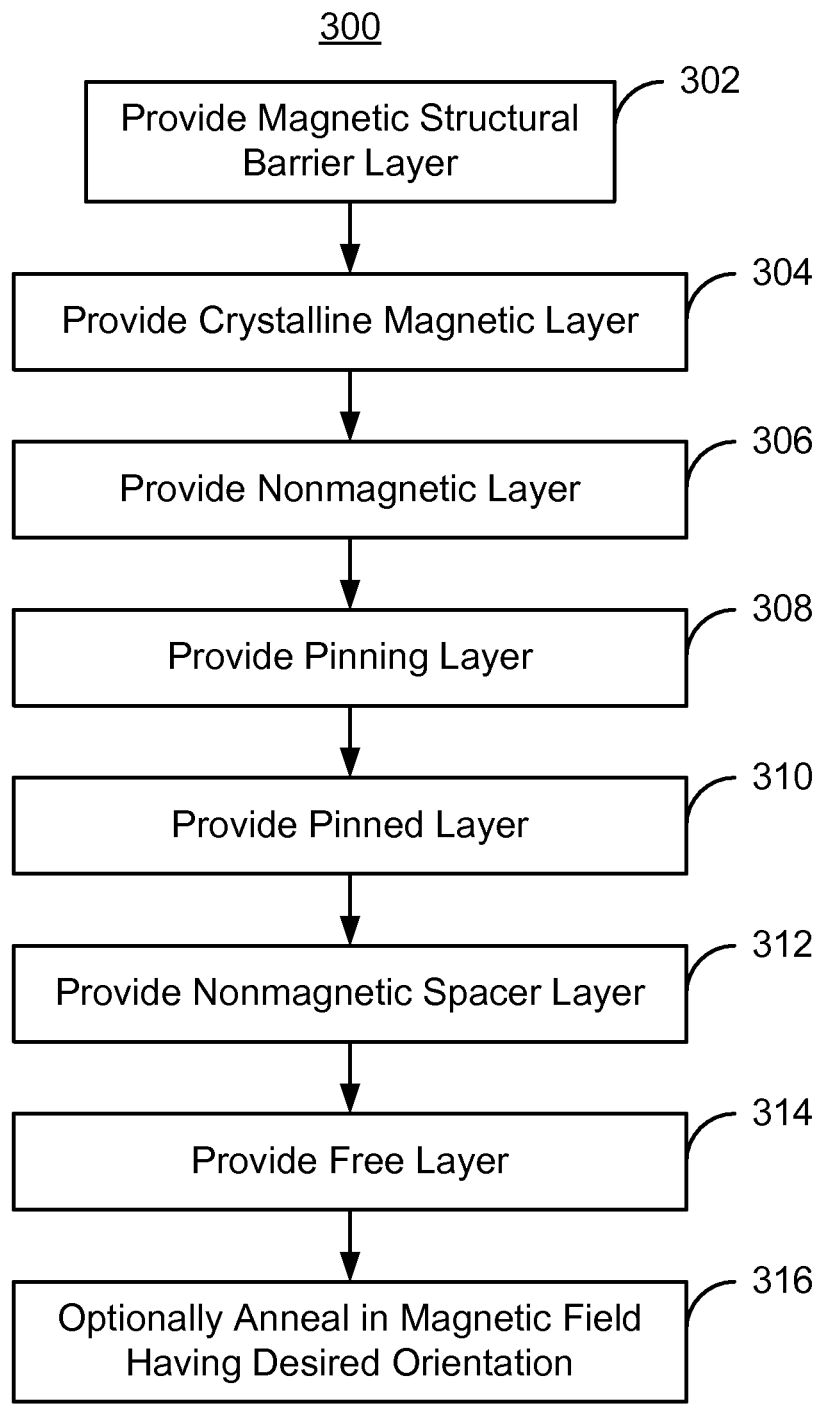
FIG. 5 depicts an exemplary embodiment of a method of forming a portion of transducer including an exemplary embodiment of seed layers.

FIG. 5 is a flow chart of an exemplary embodiment of a method 300 for fabricating a transducer. For simplicity, some steps may be omitted. The method 300 is described in the context of the transducer 110. However, the method 300 may be used for other transducers (not shown). The method 300 also may commence after formation of other structures of the read and/or write transducer. The method 300 is also described in the context of providing a single sensor 130. However, the method 300 may be used to fabricate multiple structures at substantially the same time. The method 300 and structures such as the transducer 110 are also described in the context of particular layers. However, in some embodiments, such layers may include sub-layer(s).

A magnetic structural barrier layer 114 is provided, via step 302. Step 302 may thus include depositing an amorphous magnetic seed layer. The magnetic structural barrier layer 114 may reside directly on the shield 112. However, the magnetic structural barrier layer 114 may be milled through during formation of the sensor 130'. The crystalline magnetic layer 116 is provided on the magnetic structural barrier layer 114, via step 304. In one embodiment, step 304 may include sputtering the crystalline magnetic layer 116.

A nonmagnetic seed layer 118 is provided on the crystalline magnetic layer 116, via step 306. The pinning layer 120 is provided on the nonmagnetic spacer layer 116, via step 308. The sensor may then be provided, for example using steps 310-314, described below.

The pinned layer 132 is provided on the pinning layer 120, via step 310. The nonmagnetic spacer layer 134 is provided on the pinned layer 132, via step 312. The free layer 136 is provided in step 314. In addition, a capping layer may be provided in step 314. Further, an optional anneal in a magnetic field having the desired orientation, via step 316. Thus, using the method 300, the benefits of the transducers 110 and 110' may be achieved.

We claim:

1. A magnetic transducer comprising:
    a first shield;
    a magnetic structural barrier layer sharing an interface with and being magnetically coupled with the first shield, the magnetic structural barrier layer having a thickness of fifty Angstroms and being amorphous as-deposited;
    a crystalline magnetic layer on the magnetic structural barrier layer, the magnetic structural barrier layer residing between the first shield and the crystalline magnetic layer;
    a nonmagnetic layer on the crystalline magnetic layer;
    a pinning layer on the nonmagnetic layer; and
    a sensor on the pinning layer.

2. The magnetic transducer of claim 1 wherein the sensor further includes:
    a pinned layer on the pinning layer, the pinning layer being magnetically coupled with the pinned layer;
    a free layer; and
    a nonmagnetic spacer layer between the pinned layer and the free layer.

3. The magnetic transducer of claim 1 wherein the magnetic structural barrier layer includes at least one of Co, Ni, and Fe and B.

4. The magnetic transducer of claim 3 wherein the magnetic structural barrier layer includes at least one of CoFeB, CoFeBTa, CoFeZr, and NiFeB.

5. The magnetic transducer of claim 1 wherein the magnetic structural barrier layer includes at least one spin glass.

6. The magnetic transducer of claim 2 wherein crystalline magnetic layer has a thickness of at least ten and not more than three hundred Angstroms.

7. The magnetic transducer of claim 6 wherein the thickness is at least thirty-five and not more than fifty Angstroms.

8. The magnetic transducer of claim 2 nonmagnetic layer has a thickness of at least two and not more than thirty Angstroms.

9. The magnetic transducer of claim 8 wherein the thickness is at least five and not more than twenty Angstroms.

10. The magnetic transducer of claim 2 wherein the crystalline magnetic layer is a sputtered crystalline magnetic layer.

11. The magnetic transducer of claim 2 wherein the nonmagnetic spacer layer includes at least one of a tunneling barrier layer and a conductive layer.

12. The magnetic transducer of claim 1 wherein the magnetic structural barrier layer is at least partially crystalline.

* * * * *